United States Patent
Lin

(10) Patent No.: US 12,033,684 B2
(45) Date of Patent: Jul. 9, 2024

(54) CLOCK CIRCUIT AND MEMORY

(71) Applicant: CHANGXIN MEMORY TECHNOLOGIES, INC., Hefei (CN)

(72) Inventor: Feng Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 109 days.

(21) Appl. No.: 17/709,708

(22) Filed: Mar. 31, 2022

(65) Prior Publication Data

US 2022/0223194 A1 Jul. 14, 2022

Related U.S. Application Data

(63) Continuation of application No. PCT/CN2021/104551, filed on Jul. 5, 2021.

(30) Foreign Application Priority Data

Sep. 15, 2020 (CN) .......................... 202010969644.7

(51) Int. Cl.
*G11C 11/40* (2006.01)
*G11C 11/4076* (2006.01)

(52) U.S. Cl.
CPC .................. *G11C 11/4076* (2013.01)

(58) Field of Classification Search
CPC ... G11C 11/4076; G11C 7/1093; G11C 7/222; G11C 11/406; H03K 19/09432
See application file for complete search history.

(56) References Cited

U.S. PATENT DOCUMENTS

| | | | |
|---|---|---|---|
| 6,897,697 B2 * | 5/2005 | Yin | ...................... H03K 3/3562 327/119 |
| 7,902,887 B2 | 3/2011 | Bae | |

(Continued)

FOREIGN PATENT DOCUMENTS

| | | |
|---|---|---|
| CN | 107103923 A | 8/2017 |
| CN | 110349606 A | 10/2019 |

(Continued)

OTHER PUBLICATIONS

Supplementary European Search Report in the European application No. 21868221.9, mailed on Nov. 23, 2022, 8 pgs.

(Continued)

*Primary Examiner* — Xiaochun L Chen
(74) *Attorney, Agent, or Firm* — Kilpatrick Townsend & Stockton LLP

(57) ABSTRACT

A clock circuit and a memory are provided. The clock circuit includes a data strobe clock circuit and a system clock circuit. The data strobe clock circuit is configured to receive and transmit a data strobe clock signal, the data strobe clock signal is used for controlling at least one of receiving or sending of a data signal. The system clock circuit is configured to receive and transmit a system clock signal, the system clock signal is used for controlling receiving of a command signal. The system clock circuit includes at least two first signal transmission paths, and is configured to transmit the system clock signal via different first signal transmission paths in the at least two first signal transmission paths based on at least one of: different receiving rates, or different sending rates of the data signal.

19 Claims, 6 Drawing Sheets

(56) References Cited

U.S. PATENT DOCUMENTS

| | | |
|---|---|---|
| 8,242,819 B2 | 8/2012 | Bae |
| 10,593,383 B1 | 3/2020 | Kim |
| 10,762,947 B2 | 9/2020 | Lee et al. |
| 2009/0251181 A1 | 10/2009 | Bae |
| 2011/0158030 A1 | 6/2011 | Bae |
| 2012/0170671 A1 | 7/2012 | Oh |
| 2017/0243628 A1 | 8/2017 | Chen |
| 2018/0247683 A1 | 8/2018 | Lee et al. |
| 2019/0027199 A1 | 1/2019 | Lee et al. |
| 2019/0311752 A1 | 10/2019 | Kwak et al. |
| 2019/0311753 A1 | 10/2019 | Lee et al. |
| 2020/0075069 A1 | 3/2020 | Kim |
| 2020/0111523 A1 | 4/2020 | Lee et al. |
| 2020/0143859 A1 | 5/2020 | Lee et al. |
| 2020/0176038 A1 | 6/2020 | Kim |

FOREIGN PATENT DOCUMENTS

| | | |
|---|---|---|
| CN | 110880341 A | 3/2020 |
| CN | 111009270 A | 4/2020 |

OTHER PUBLICATIONS

International Search Report and English Translation as cited in PCT/CN2021/104551, mailed on Sep. 17, 2021, 5 pages.
KS Ha, et. al., "A 7.5Gb/s/pin LPDDR5 SDRAM with WCK Clocking and Non-Target ODT for High Speed and with DVFS, Internal Data Copy, and Deep-Sleep Mode for Low Power", ISSCC 2019 Digest, Session 23.1, pp. 378-379.
Korean Intellectual Property Office, First Office Action Issued in Application No. 10-2022-7021268, Apr. 26, 2024, 12 pages.
Rex Kho et al., "A 75 nm 7 GB/s/pin 1 Gb GDDR5 Graphics Memory Device With Bandwidth Improvement Techniques", IEEE Journal of Solid-State Circuits, vol. 45, No. 1, Jan. 2010.

\* cited by examiner

CLOCK CIRCUIT AND MEMORY

CROSS-REFERENCE TO RELATED APPLICATION

This application is a continuation of International Application No. PCT/CN2021/104551, filed on Jul. 5, 2021, and claims priority to Chinese patent application No. 202010969644.7, filed on Sep. 15, 2020 and entitled "CLOCK CIRCUIT AND MEMORY". The contents of International Application No. PCT/CN2021/104551 and Chinese patent application No. 202010969644.7 are hereby incorporated by reference in their entireties.

BACKGROUND

The Dynamic Random Access Memory (DRAM) is a semiconductor memory device commonly used in computers, and is composed of many repeated memory cells. Each memory cell generally includes a capacitor and a transistor. The gate of the transistor is connected to a word line, the drain of the transistor is connected to a bit line, and the source of the transistor is connected to the capacitor. A voltage signal on the word line can control turn-on or turn-off of the transistor, such that data information stored in the capacitor can be read through the bit line or data information can be written into the capacitor through the bit line for storage.

The DRAM may include the Double Data Rate (DDR) synchronous DRAM, the Graphics Double Data Rate (GDDR) DRAM, and the Low Power Double Data Rate (LPDDR) synchronous DRAM. As the DRAM has been used in more and more fields, for example, the DRAM has more and more been used in the mobile field, users have higher and higher requirements for DRAM power consumption indicators.

However, at present, improvement in the performance of the DRAM is still required.

SUMMARY

Embodiments of the present disclosure relate to the field of semiconductor technologies, and in particular to a clock circuit and a memory.

In a first aspect, the embodiments of the present disclosure provide a clock circuit. The clock circuit may include a data strobe clock circuit and a system clock circuit.

The data strobe clock circuit may be configured to receive a data strobe clock signal and transmit the data strobe clock signal. The data strobe clock signal may be used for controlling at least one of receiving or sending of a data signal.

The system clock circuit may be configured to receive a system clock signal and transmit the system clock signal. The system clock signal may be used for controlling receiving of a command signal.

The system clock circuit may include at least two first signal transmission paths, and may be configured to transmit the system clock signal via different first signal transmission paths among the at least two first signal transmission paths based on at least one of: different receiving rates, or different sending rates of the data signal.

In a second aspect, the embodiments of the present disclosure further provide a memory. The memory may include a clock circuit. The clock circuit may include a data strobe clock circuit and a system clock circuit.

The data strobe clock circuit may be configured to receive a data strobe clock signal and transmit the data strobe clock signal. The data strobe clock signal may be used for controlling at least one of receiving or sending of a data signal.

The system clock circuit may be configured to receive a system clock signal and transmit the system clock signal. The system clock signal may be used for controlling receiving of a command signal.

The system clock circuit may include at least two first signal transmission paths, and may be configured to transmit the system clock signal via different first signal transmission paths among the at least two first signal transmission paths based on at least one of: different receiving rates, or different sending rates of the data signal.

BRIEF DESCRIPTION OF THE DRAWINGS

One or more embodiments are exemplified by the figures in the corresponding accompany drawings. These exemplary illustrations do not constitute any limitation to the embodiments. The elements with the same reference numerals in the accompany drawings are denoted as similar elements. Unless otherwise stated, the figures in the accompany drawings do not constitute any scale limitation.

DETAILED DESCRIPTION

In order to alleviate timing constraints on read and write for a memory, a WCK clock signal, i.e., a data strobe clock signal, is introduced into the memory. In order to adapt to different performance requirements, a data transmission rate of the same memory may be fast or slow, and accordingly, a transmission rate of the WCK clock signal may exceed a preset value or may be lower than the preset value. For example, if the data transmission rate exceeds 3200 Mbps, a Current Mode Logic (CML) frequency divider can be introduced to reduce interference on the WCK clock signal; if the data transmission rate is lower than 3200 Mbps, a CMOS frequency divider can be used to save power consumption to the greatest extent.

That is to say, when the transmission rates of the WCK clock signal in the memory are different, the WCK clock signal is transmitted via different transmission paths. In the memory, there is also a CK clock signal (i.e., a system clock signal) for controlling a command/address signal. Moreover, the alignment of a clock domain of the WCK clock signal and a clock domain of the CK clock signal needs to be considered, and the WCK2CK synchronization and handshake functions between the two clock domains should also be considered. If the CK clock signal is transmitted via the same transmission path, it is difficult to ensure that the CK clock signal has excellent synchronization performance with both the high-speed WCK clock signal and the low-speed WCK clock signal.

In order to solve the above problem, the embodiments of the present disclosure provide a clock circuit, so as to ensure that the CK clock signal has excellent synchronization performance with both the high-speed and low-speed WCK clock signals.

To make the objective, the technical solutions, and the advantages of the embodiments of the present disclosure clearer, the embodiments of the present disclosure are described in details below with reference to the accompanying drawings. Moreover, persons of ordinary skill in the art can understand that in the embodiments of the present disclosure, many technical details are provided for readers to better understand the present disclosure. However, the technical solutions of the present disclosure can be implemented even without these technical details and based on various variations and modifications of the following embodiments.

Figure 1:
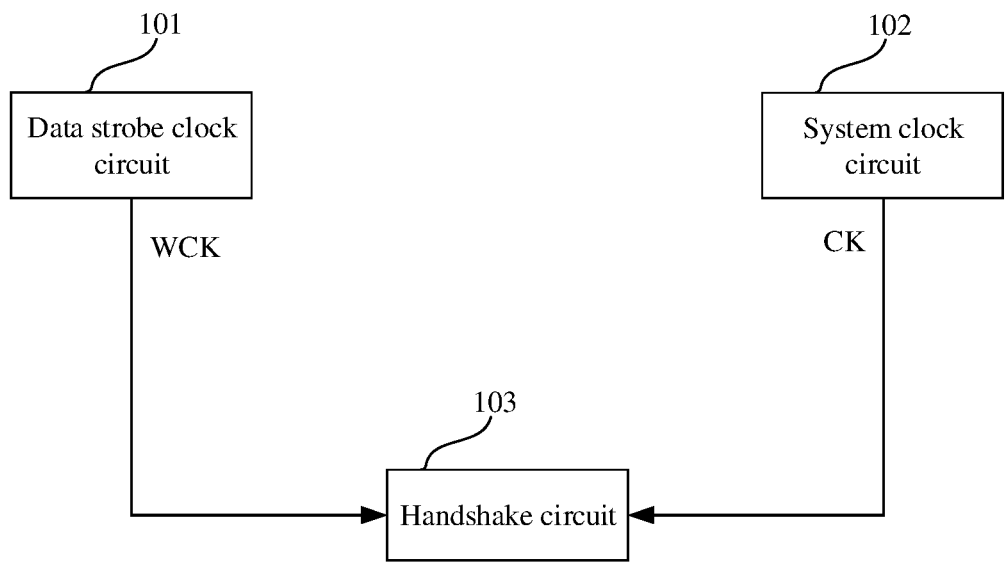
FIG. 1 illustrates a functional block diagram of a clock circuit provided by an embodiment of the present disclosure.
Figure 2:
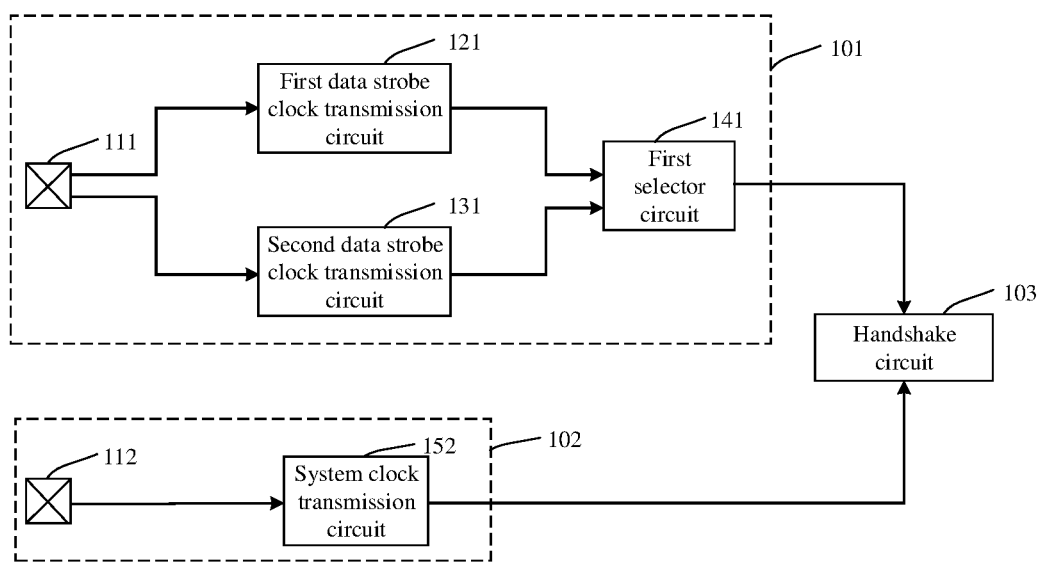
FIG. 2 illustrates another functional block diagram of a clock circuit provided by an embodiment of the present disclosure.
Figure 3:
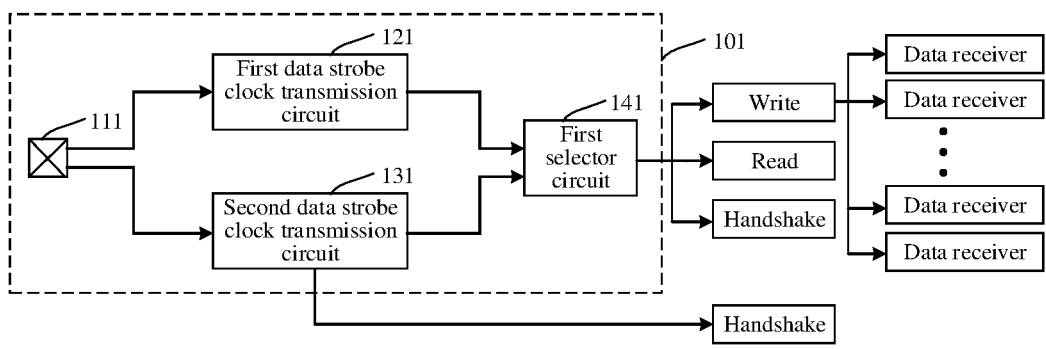
FIG. 3 illustrates a diagram of the working principle of a data strobe clock circuit in FIG. 2.
Figure 4:
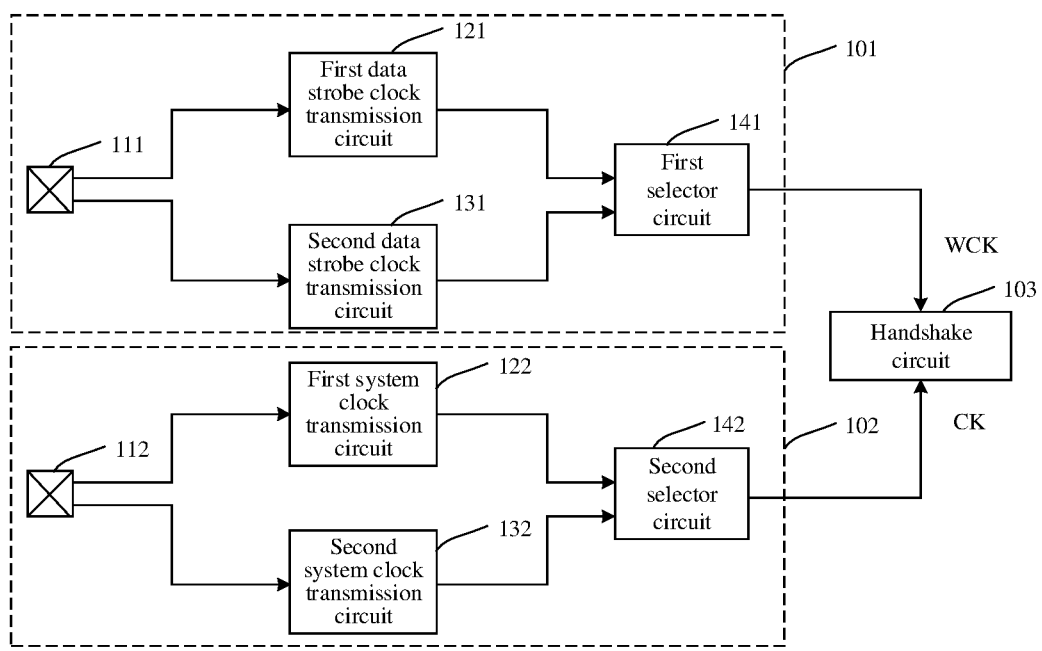
FIG. 4 illustrates yet another functional block diagram of a clock circuit provided by an embodiment of the present disclosure.
Figure 5:
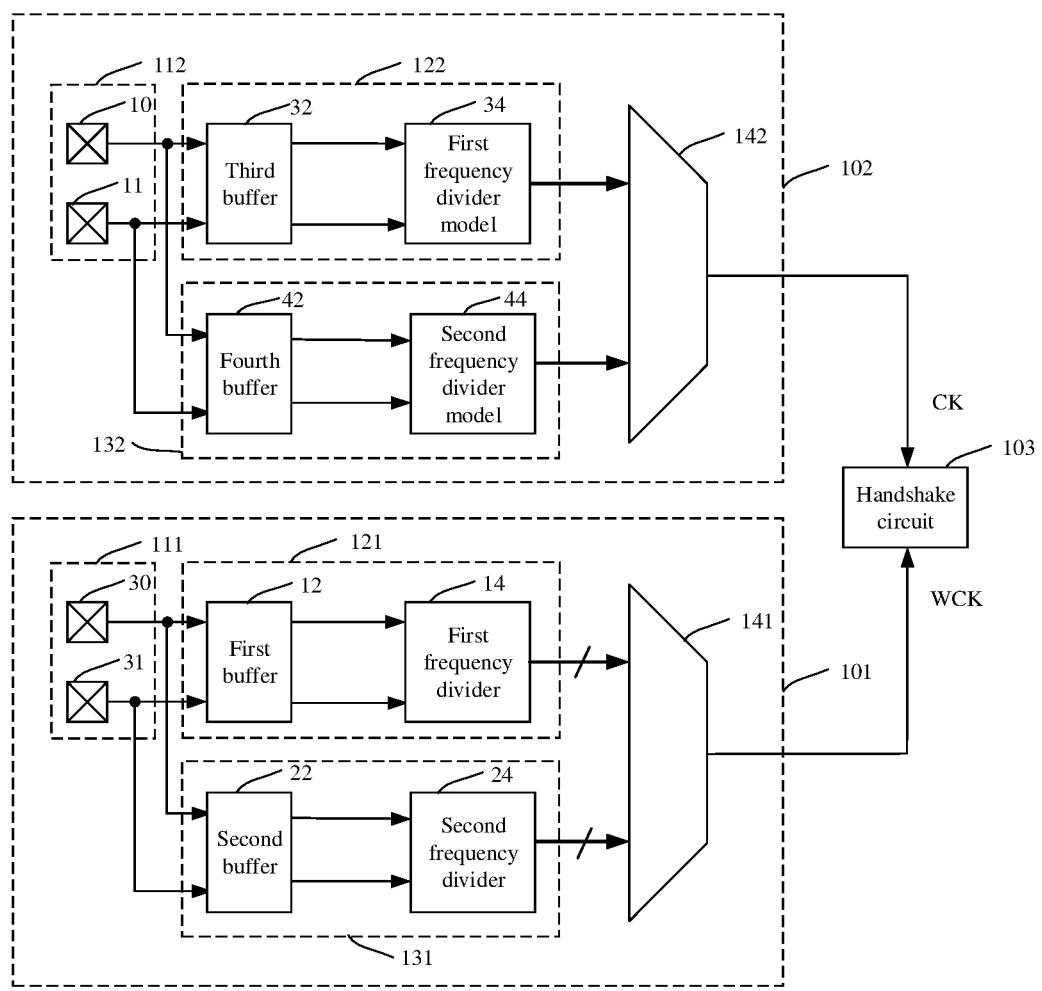
FIG. 5 illustrates a structural diagram of a clock circuit provided by an embodiment of the present disclosure.
Figure 6:
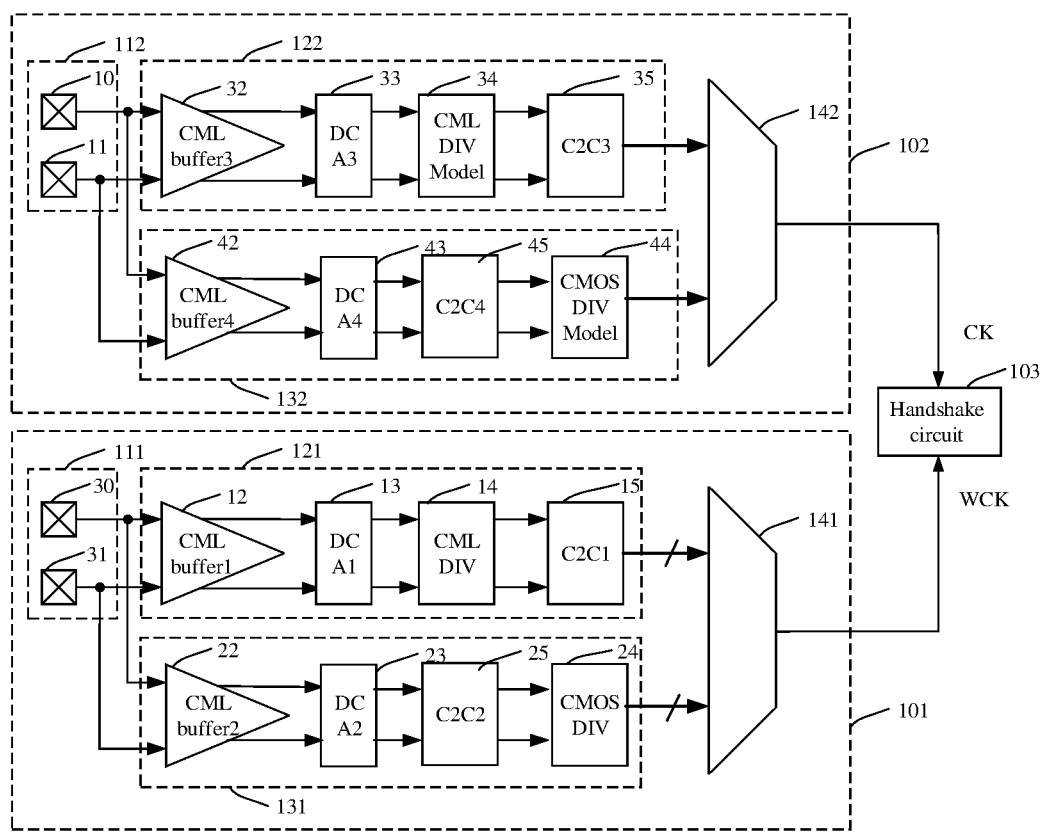
FIG. 6 illustrates another structural diagram of a clock circuit provided by an embodiment of the present disclosure.

FIG. 1 illustrates a functional block diagram of a clock circuit provided by an embodiment of the present disclosure. FIG. 2 illustrates another functional block diagram of a clock circuit. FIG. 3 illustrates a diagram of the working principle of a data strobe clock circuit in FIG. 2. FIG. 4 illustrates yet another functional block diagram of a clock circuit. FIG. 5 illustrates a structural diagram of a clock circuit provided by an embodiment of the present disclosure. FIG. 6 illustrates another structural diagram of a clock circuit provided by an embodiment of the present disclosure.

With reference to FIG. 1, in this embodiment, the clock circuit includes: a data strobe clock circuit 101 and a system clock circuit 102. The data strobe clock circuit 101 is configured to receive a data strobe clock signal WCK and transmit the data strobe clock signal WCK, herein, the data strobe clock signal WCK is used for controlling at least one of receiving or sending of a data signal. The system clock circuit 102 is configured to receive a system clock signal CK and transmit the system clock signal CK, herein, the system clock signal CK is used for controlling receiving of a command signal. The system clock circuit 102 includes at least two first signal transmission paths, and is configured to transmit the system clock signal CK via different first signal transmission paths among the at least two first signal transmission paths based on at least one of: different receiving rates, or different sending rates of the data signal.

The clock circuit provided by this embodiment is described in details below with reference to the accompanying drawings.

In this embodiment, the at least one of: the receiving rates, or the sending rates of the data signals may include a high transmission rate and a low transmission rate, and correspondingly, the data strobe clock signal WCK has a high-speed signal transmission path and a low-speed signal transmission path. That is, the data strobe clock circuit 101 has different second signal transmission paths, including the low-speed signal transmission path and the high-speed signal transmission path, so that when the data strobe clock signal WCK is a high-speed clock signal, the corresponding signal transmission path has a strong anti-interference capability, and when the data strobe clock signal WCK is a low-speed clock signal, the corresponding signal transmission path has low power consumption, thereby satisfying the requirement for the strong anti-interference capability in the case of the high-speed clock signal and the requirement for low power consumption in the case of the low-speed clock signal. It can be understood that the high speed and the low speed are two relative expressions and thus are clearly defined.

Correspondingly, the system clock circuit 102 has different first signal transmission paths, and each first signal transmission path corresponds to a respective signal transmission path in the data strobe clock circuit 101, so that each first signal transmission path matches the respective one of the second signal transmission paths. Specifically, the matching can be understood as: the influence of each first signal transmission path on the system clock signal CK and the influence of the second signal transmission path corresponding to the first signal transmission path on the data strobe clock signal WCK are synchronous. The influence includes clock signal delay, clock signal loss, clock signal disturbance, and/or the like.

In this embodiment, for example, the matching of the clock signal delay is performed between each first signal transmission path and the second signal transmission path corresponding to the first signal transmission path, so that the data strobe clock signal WCK having different transmission rates can well implement synchronous handshake with the system clock signal CK.

In this embodiment, the clock circuit further includes a handshake circuit 103 connected to the data strobe clock circuit 101 and the system clock circuit 102, and configured to determine a phase relationship between the system clock signal CK and the data strobe clock signal WCK.

As stated above, the data strobe clock circuit 101 includes at least two second signal transmission paths, the data strobe clock signal WCK is transmitted via different second signal transmission paths among the at least two second signal transmission paths at different transmission rates, each of the transmission rates corresponds to a respective one of the at least one of: the receiving rates, or the sending rates, and each of the second signal transmission paths corresponds to a respective one of the first signal transmission paths.

The system clock circuit 102 is configured to transmit, when the data strobe clock signal WCK is transmitted via a second signal transmission path in the second signal transmission paths, the system clock signal CK via the first signal transmission path corresponding to the second signal transmission path. That is to say, when the data strobe clock circuit 101 uses a specific second signal transmission path to transmit the data strobe clock signal WCK, the system clock circuit 102 also uses a specific corresponding first signal transmission path to transmit the system clock signal CK.

Specifically, as illustrated in FIG. 2, the data strobe clock circuit 101 includes a first data strobe clock transmission circuit 121 and a second data strobe clock transmission circuit 131. The first data strobe clock transmission circuit 121 and the second data strobe clock transmission circuit 131 define the different second signal transmission paths. The data strobe clock circuit 101 is configured to transmit, if a transmission rate in the transmission rates is greater than or equal to a preset value, the data strobe clock signal WCK through the first data strobe clock transmission circuit 121; and transmit, if the transmission rate is less than the preset value, the data strobe clock signal WCK through the second data strobe clock transmission circuit 131.

The preset value can be reasonably set according to performance requirements of a memory; the first data strobe clock transmission circuit 121 is configured to define the high-speed transmission path; and the second data strobe clock transmission circuit 131 is configured to define the low-speed transmission path. It should be noted that in other embodiments, the data strobe clock circuit may also include three or more second signal transmission paths, that is, the data strobe clock circuit has three or more data strobe clock transmission circuits.

The data strobe clock circuit 101 further includes: a first selector circuit 141 and a data clock pad 111. The first selector circuit 141 is configured to select an output signal of one of the first data strobe clock transmission circuit 121 and the second data strobe clock transmission circuit 131 for output. The data clock pad 111 is configured to receive the data strobe clock signal WCK and transmit the data strobe clock signal WCK to the first data strobe clock transmission circuit 121 and the second data strobe clock transmission circuit 131.

In one example, the data strobe clock signal WCK is transmitted to the first data strobe clock transmission circuit 121 and the second data strobe clock transmission circuit 131 through the data clock pad 111, and after transmission via two second signal transmission paths, two data strobe clock signals WCK reach the first selector circuit 141; and the first selector circuit 141 selects, based on a receiving rate or a sending rate of the data signal among the at least one of: the receiving rates, or the sending rates of the data signal, the output signal of the first data strobe clock transmission circuit 121 or the second data strobe clock transmission circuit 131 for output. More specifically, if the receiving rate or the sending rate of the data signal is less than a preset value, the first selector circuit 141 selects the output signal of the second data strobe clock transmission circuit 131 for output; if the receiving rate or the sending rate of the data signal is greater than or equal to the preset value, the first selector circuit 141 selects the output signal of the first data strobe clock transmission circuit 121 for output.

In another example, the data strobe clock signal WCK is transmitted to the first data strobe clock transmission circuit 121 and the second data strobe clock transmission circuit 131 through the data clock pad 111; and the first selector circuit 141 selects one of the first data strobe clock transmission circuit 121 and the second data strobe clock transmission circuit 131 for clock signal transmission, and the other of the first data strobe clock transmission circuit 121 and the second data strobe clock transmission circuit 131 does not operate. In this case, only one of the first data strobe clock transmission circuit 121 and the second data strobe clock transmission circuit 131 operates, so that the power consumption of the clock circuit can be further reduced.

As illustrated in FIG. 3, the data strobe clock signal WCK output by the first selector circuit 141 can be used for implement "read", "write", "handshake" and other functions. For the implementation of the "write" function, the data strobe clock signal WCK is transmitted to multiple corresponding data receivers. In addition, when the output of the data strobe clock circuit 101 is provided by the second data strobe clock transmission circuit 131, in order to avoid the problems such as transmission loss caused by the first selector circuit 141 to the data strobe clock signal WCK, the output of the second data strobe clock transmission circuit 131 can also be directly output to the handshake circuit 103 to implement the "handshake" function, without passing through the first selector circuit 141.

The system clock circuit 102 includes a system clock pad 112 and a system clock transmission circuit 152. The system clock pad 112 is configured to receive the system clock signal CK and transmit the system clock signal to the system clock transmission circuit 152, and the system clock transmission circuit 152 has the at least two first signal transmission paths.

As illustrated in FIG. 4, the system clock circuit 102 includes a first system clock transmission circuit 122 and a second system clock transmission circuit 132. The first system clock transmission circuit 122 and the second system clock transmission circuit 132 define the different first signal transmission paths. The system clock circuit 102 is configured to transmit, if the data strobe clock signal WCK is transmitted through the first data strobe clock transmission circuit 121, the system clock signal CK through the first system clock transmission circuit 122, and transmit, if the data strobe clock signal WCK is transmitted through the second data strobe clock transmission circuit 131, the system clock signal CK through the second system clock transmission circuit 132.

Specifically, the first system clock transmission circuit 122 is configured to match the first data strobe clock transmission circuit 121, and the second system clock transmission circuit 132 is configured to match the second data strobe clock transmission circuit 131. In one example, a clock delay of the first system clock transmission circuit 122 with respect to the system clock signal CK matches a clock delay of the first data strobe clock transmission circuit 121 with respect to the data strobe clock signal WCK, and a clock delay of the second system clock transmission circuit 132 with respect to the system clock signal CK matches a clock delay of the second data strobe clock transmission circuit 131 with respect to the data strobe clock signal WCK. It should be noted that in other embodiments, the data strobe clock circuit has three or more second signal transmission paths, and the system clock circuit also has three or more first signal transmission paths, that is, the system clock circuit also has three or more system clock transmission circuits.

The system clock circuit further includes a second selector circuit 142. The second selector circuit 142 is configured to select an output signal of one of the first system clock transmission circuit 122 and the second system clock transmission circuit 132 for output.

In one example, the system clock signal CK is transmitted to the first system clock transmission circuit 122 and the second system clock transmission circuit 132 through the system clock pad 112, and after transmission via two first signal transmission paths, two system clock signals CK reach the second selector circuit 142; and the second selector circuit 142 selects, based on the receiving rate or the sending rate of the data signal, the output signal of the first system clock transmission circuit 122 or the second system clock transmission circuit 132 for output. More specifically, if the receiving rate or the sending rate of the data signal is less than the preset value, the second selector circuit 142 selects the output signal of the second system clock transmission circuit 132 for output; if the receiving rate or the sending rate of the data signal is greater than or equal to the preset value, the second selector circuit 142 selects the output signal of the first system clock transmission circuit 122 for output.

In another example, the data system signal CK is transmitted to the first system clock transmission circuit 122 and the second system clock transmission circuit 132 through the system clock pad 112; and the second selector circuit 142 selects one of the first system clock transmission circuit 122 and the second system clock transmission circuit 132 for clock signal transmission, and the other of the first system clock transmission circuit 122 and the second system clock transmission circuit 132 does not operate. In this case, only one of the first system clock transmission circuit 122 and the second system clock transmission circuit 132 operates, so that the power consumption of the clock circuit can be further reduced.

Since the system clock circuit 102 has multiple first signal transmission paths, better clock matching can be achieved for the data strobe clock signal WCK having different transmission rates. For example, the system clock signal CK and the data strobe clock signal WCK match in clock delay, clock jitter and/or the like. Therefore, even if the receiving rate or the sending rate of the data signal changes, the handshake circuit 103 can still implement synchronous handshake between the system clock signal CK and the data strobe clock signal WCK.

Specifically, the handshake circuit 103 is connected to outputs of the first selector circuit 141 and the second selector circuit 142 and configured to determine a phase relationship between the system clock signal and the data strobe clock signal.

In addition, the data strobe clock signal WCK may be a differential clock signal. Accordingly, as illustrated in FIG. 5, the data clock pad 111 includes a first data clock pad 30 and a second data clock pad 31 configured to respectively receive the differential data strobe clock signals WCK, which can be called as a WCK_t clock signal and a WCK_c clock signal. Similarly, the system clock signal CK may be a differential clock signal. Accordingly, as illustrated in FIG. 5, the system clock pad 112 includes a first system clock pad 10 and a second system clock pad 11 configured to respectively receive the differential system clock signals CK, which may be a CK_t clock signal and a CK_c clock signal.

As illustrated in FIG. 5, the first data strobe clock transmission circuit 121 includes a first frequency divider 14; the second data strobe clock transmission circuit 131 includes a second frequency divider 24; and the first frequency divider 14 is configured to divide a frequency of the data strobe clock signal WCK and output at least two frequency-divided data strobe clock signals having different phases, and the second frequency divider 24 is configured to divide a frequency of the data strobe clock signal WCK and output at least two frequency-divided data strobe clock signals having different phases.

The first frequency divider 14 has a first correlation between power consumption and the frequency of the data strobe clock signal WCK, the second frequency divider 24 has a second correlation between power consumption and the frequency of the data strobe clock signal WCK, and the first correlation is weaker than the second correlation; and/or, the first frequency divider 14 has a first anti-interference capability, the second frequency divider 24 has a second anti-interference capability, and the first anti-interference capability is stronger than the second anti-interference capability.

The first frequency divider 14 is configured to divide the frequency of the data strobe clock signal WCK having a high transmission rate, and the second frequency divider 24 is configured to divide the frequency of the data strobe clock signal WCK having a low transmission rate. That is, the first frequency divider 14 divides the frequency of the data strobe clock signal WCK having the high frequency, and the second frequency divider 24 divides the frequency of the data strobe clock signal WCK having the low frequency. Since the first correlation is weaker than the second correlation and a static power consumption of the first frequency divider 14 is higher than a static power consumption of the second frequency divider 24, the second frequency divider 24 can maintain relatively low power consumption, thereby avoiding the problem of excessive power consumption of a low-speed transmission path. Since the first anti-interference capability is stronger than the second anti-interference capability, the problem that a high-speed transmission path causes interference on the data strobe clock signal WCK is avoided, so that the data strobe clock signal WCK transmitted via the high-speed transmission path has high accuracy.

In this embodiment, as illustrated in FIG. 6, the first frequency divider 14 includes a current-mode logic (CML) frequency divider circuit, and in FIG. 6, the CML frequency divider circuit is denoted as CML DIV; and the second frequency divider 24 includes a Complementary Metal Oxide Semiconductor (CMOS) frequency divider circuit, and in FIG. 6, the CMOS frequency divider circuit is denoted as CMOS DIV.

For the CML frequency divider circuit, the static power consumption is relatively high, the correlation between the power consumption and the frequency is weak, the anti-interference capability is strong, and the anti-interference capability for power supply jitter/toggle is strong; and for the CMOS frequency divider circuit, the power consumption is low, the correlation between the power consumption and the frequency is strong, the lower the frequency, the lower the power consumption, the influence of power supply noise on clock jitter is large, and the capability of resisting against power supply interference is weak. The high-speed transmission path uses the CML frequency divider circuit to ensure the strong anti-interference capability of the data strobe clock signal, and the low-speed transmission path uses the CMOS frequency divider circuit with the low power consumption to achieve the objective of power saving in the case of a low speed.

The first data strobe clock transmission circuit 121 further includes a CML to CMOS circuit, configured to be connected to the CML frequency divider circuit and output the frequency-divided data strobe clock signals. The CML to CMOS circuit is defined as a first CML to CMOS circuit 15. As illustrated in FIG. 6, in FIG. 6, the first CML to CMOS circuit 15 is denoted as C2C1.

The second data strobe clock transmission circuit 131 further includes a CML to CMOS circuit 25, configured to output the data strobe clock signal to the CMOS frequency divider circuit. The CML to CMOS circuit is defined as a second CML to CMOS circuit 25. As illustrated in FIG. 6, in FIG. 6, the second CML to CMOS circuit 25 is denoted as C2C2.

In addition, each of the first data strobe clock transmission circuit 121 and the second data strobe clock transmission circuit 131 includes a buffer, configured to buffer and receive the data strobe clock signal. Specifically, the buffer in the first data strobe clock transmission circuit 121 is defined as a first buffer 12, and the buffer in the second data strobe clock transmission circuit 131 is defined as a second buffer 22.

In this embodiment, the buffer is a CML buffer. As illustrated in FIG. 6, in FIG. 6, the first buffer 12 is denoted as CML buffer1, and the second buffer 22 is denoted as CML buffer2.

As illustrated in FIG. 5, the first system clock transmission circuit 122 includes a first frequency divider model 34, and the second system clock transmission circuit 132 includes a second frequency divider model 44; and the first frequency divider model 34 is configured to match a clock delay of the first data strobe clock transmission circuit 121, and the second frequency divider model 44 is configured to match a clock delay of the second data strobe clock transmission circuit 131.

It can be understood that the first frequency divider model 34 does not actually perform frequency division processing on the system clock signal, and the second frequency divider model 44 does not actually perform frequency division processing on the system clock signal.

Specifically, as illustrated in FIG. 6, the first frequency divider model 34 includes a CML frequency divider circuit model, and the second frequency divider model 44 includes a CMOS frequency divider circuit model. In FIG. 6, the CML frequency divider circuit model is denoted as CML DIV Model, and the CMOS frequency divider circuit model is denoted as CMOS DIV Model.

The first system clock transmission circuit 122 further includes a CML to CMOS circuit, configured to be connected to the CML frequency divider circuit model and output the system clock signal. The CML to CMOS circuit is defined as a third CML to CMOS circuit 35. In FIG. 6, the third CML to CMOS circuit 35 is denoted as C2C3.

The second system clock transmission circuit 132 further includes a CML to CMOS circuit, configured to output the system clock signal to the CMOS frequency divider circuit model. The CML to CMOS circuit is defined as a fourth CML to CMOS circuit 45. In FIG. 6, the fourth CML to CMOS circuit 45 is denoted as C2C4.

Each of the first system clock transmission circuit 122 and the second system clock transmission circuit 132 includes a buffer, configured to buffer and receive the system clock signal. Specifically, the buffer in the first system clock transmission circuit 122 is defined as a third buffer 32, and the buffer in the second system clock transmission circuit 132 is defined as a fourth buffer 42.

In this embodiment, the buffer is a CML buffer. As illustrated in FIG. 6, in FIG. 6, the third buffer 32 is denoted as CML buffer3, and the fourth buffer 42 is denoted as CML buffer4.

It should be noted that in this embodiment, the buffer is the CML buffer. In other embodiments, the above buffer may also be a CMOS buffer, and accordingly, there is no need to provide the CML to CMOS circuit between the buffer and another structure (such as the CMOS frequency divider).

In addition, the first data strobe clock transmission circuit 121, the second data strobe clock transmission circuit 131, the first system clock transmission circuit 122, and the second system clock transmission circuit 132 each include a Duty Cycle Adjuster (DCA), configured to adjust a duty cycle of the data strobe clock signal or a duty cycle of the system clock signal. The DCA in the first data strobe clock transmission circuit 121 is defined as a first DCA 13, the DCA in the second data strobe clock transmission circuit 131 is defined as a second DCA 23, the DCA in the first system clock transmission circuit 122 is defined as a third DCA 33, and the DCA in the second system clock transmission circuit 132 is defined as a fourth DCA 43. In FIG. 6, the first DCA 13, the second DCA 23, the third DCA 33, and the fourth DCA 43 are respectively denoted as DCA1, DCA2, DCA3, and DCA4.

According to the clock circuit provided by this embodiment, the system clock circuit 102 includes at least two first signal transmission paths, and transmits the system clock signal via different paths among the at least two first signal transmission paths based on at least one of: different receiving rates, or different sending rates of the data signal. When the data strobe clock signal is transmitted at different transmission rates, correspondingly, the system clock signal is transmitted via the different first signal transmission paths, so that the data strobe clock signal transmitted at the different transmission rates can all be matched with the system clock signal accordingly. Therefore, although the transmission rate of the data strobe clock signal changes, the clock difference between the data strobe clock signal and the system clock signal changes little, or the clock difference between the data strobe clock signal and the system clock signal can even remain unchanged. Therefore, the handshake circuit 103 can well align the data strobe clock signal and the system clock signal, thereby making synchronization and handshake functions easier to implement.

In addition, the first data strobe clock transmission circuit 121 that defines the high-speed transmission path includes the CML frequency divider circuit, and the CML frequency divider circuit has the advantage of the strong anti-interference capability, so that there is little interference on the data strobe clock signal transmitted at a high speed, thereby ensuring the accuracy of the data strobe clock signal. The second data strobe clock transmission circuit 131 that defines the low-speed transmission path includes the CMOS frequency divider circuit, and the CMOS frequency divider circuit has the advantage of the low power consumption, thereby facilitating reducing power consumption of the clock circuit. Therefore, this embodiment has the advantages of the strong anti-interference capability in the case of the high speed and the low power consumption in the case of the low speed.

Accordingly, the embodiments of the present disclosure further provide a memory, including the aforementioned clock circuit.

The memory may be a DDR memory, such as a DDR5 memory.

Persons of ordinary skill in the art can understand that the above embodiments are specific embodiments for implementing the present disclosure, and in actual applications, various variations can be made in form and detail, without departing from the spirit and scope of the present disclosure. Any persons skilled in the art can make variations and modifications, without departing from the spirit and scope of the present disclosure. Therefore, the scope of protection of the present disclosure shall fall within the scope defined by the claims.

INDUSTRIAL APPLICABILITY

In the embodiments of the present disclosure, the system clock circuit includes at least two first signal transmission paths, and transmits the system clock signal via different paths among the at least two first signal transmission paths based on at least one of: different receiving rates, or different sending rates of the data signal. When the data strobe clock signal is transmitted at different transmission rates, correspondingly, the system clock signal is transmitted via the different first signal transmission paths, so that the data strobe clock signal transmitted at the different transmission rates can be matched with the system clock signal accordingly. Therefore, although the transmission rate of the data strobe clock signal changes, the clock difference between the data strobe clock signal and the system clock signal changes little, or the clock difference between the data strobe clock signal and the system clock signal can even remain unchanged. Therefore, the handshake circuit can well align the data strobe clock signal and the system clock signal, thereby making synchronization and handshake functions easier to implement.

The invention claimed is:
1. A clock circuit, comprising:
a data strobe clock circuit, configured to receive a data strobe clock signal and transmit the data strobe clock signal, wherein the data strobe clock signal is used for controlling at least one of receiving or sending of a data signal; and
a system clock circuit configured to receive a system clock signal and transmit the system clock signal, wherein the system clock signal is used for controlling receiving of a command signal;
wherein the system clock circuit comprises at least two first signal transmission paths, and is configured to transmit the system clock signal via different first signal transmission paths among the at least two first signal transmission paths based on at least one of: different receiving rates, or sending rates of the data signal;

wherein the data strobe clock circuit comprises at least two second signal transmission paths, the data strobe clock signal is transmitted via different second signal transmission paths among the at least two second signal transmission paths at different transmission rates, each of the transmission rates corresponds to a respective one of the at least one of: the receiving rates, or the sending rates of the data signal, and each of the at least two second signal transmission paths is matched with a respective one of the at least two first signal transmission paths; and wherein the system clock circuit is configured to transmit, when the data strobe clock signal is transmitted via a second signal transmission path in the at least two second signal transmission paths, the system clock signal via a first signal transmission path in the at least two first signal transmission paths matching with the second signal transmission path.

2. The clock circuit of claim 1, wherein the data strobe clock circuit comprises a first data strobe clock transmission circuit and a second data strobe clock transmission circuit, and the first data strobe clock transmission circuit and the second data strobe clock transmission circuit define the different second signal transmission paths; and the data strobe clock circuit is configured to transmit, when a transmission rate in the transmission rates is greater than or equal to a preset value, the data strobe clock signal through the first data strobe clock transmission circuit, and transmit, when the transmission rate is less than the preset value, the data strobe clock signal through the second data strobe clock transmission circuit.

3. The clock circuit of claim 2, wherein the first data strobe clock transmission circuit comprises a first frequency divider; the second data strobe clock transmission circuit comprises a second frequency divider; and the first frequency divider is configured to divide a frequency of the data strobe clock signal and output at least two frequency-divided data strobe clock signals having different phases, and the second frequency divider is configured to divide the frequency of the data strobe clock signal and output another at least two frequency-divided data strobe clock signals having different phases.

4. The clock circuit of claim 3, wherein the first frequency divider has a first correlation between power consumption and the frequency of the data strobe clock signal, the second frequency divider has a second correlation between the power consumption and the frequency of the data strobe clock signal, and the first correlation is weaker than the second correlation; or, the first frequency divider has a first anti-interference capability, the second frequency divider has a second anti-interference capability, and the first anti-interference capability is stronger than the second anti-interference capability.

5. The clock circuit of claim 3, wherein the first frequency divider comprises a current-mode logic frequency divider circuit, and the second frequency divider comprises a complementary metal oxide semiconductor (CMOS) frequency divider circuit.

6. The clock circuit of claim 5, wherein the first data strobe clock transmission circuit further comprises a current-mode logic to CMOS circuit, configured to be connected to the current-mode logic frequency divider circuit and output the at least two frequency-divided data strobe clock signals.

7. The clock circuit of claim 5, wherein the second data strobe clock transmission circuit further comprises a current-mode logic to CMOS circuit, configured to output the data strobe clock signal to the CMOS frequency divider circuit.

8. The clock circuit of claim 2, wherein each of the first data strobe clock transmission circuit and the second data strobe clock transmission circuit comprises a buffer, configured to buffer and receive the data strobe clock signal.

9. The clock circuit of claim 8, wherein the buffer is a current-mode logic buffer.

10. The clock circuit of claim 2, wherein the system clock circuit comprises a first system clock transmission circuit and a second system clock transmission circuit, and the first system clock transmission circuit and the second system clock transmission circuit define the different first signal transmission paths; and the system clock circuit is configured to transmit, when the data strobe clock signal is transmitted through the first data strobe clock transmission circuit, the system clock signal through the first system clock transmission circuit, and transmit, when the data strobe clock signal is transmitted through the second data strobe clock transmission circuit, the system clock signal through the second system clock transmission circuit.

11. The clock circuit of claim 10, wherein the first system clock transmission circuit comprises a first frequency divider model, and the second system clock transmission circuit comprises a second frequency divider model; and the first frequency divider model is configured to match a clock delay of the first data strobe clock transmission circuit, and the second frequency divider model is configured to match a clock delay of the second data strobe clock transmission circuit.

12. The clock circuit of claim 11, wherein the first frequency divider model comprises a current-mode logic frequency divider circuit model, and the second frequency divider model comprises a complementary metal oxide semiconductor (CMOS) frequency divider circuit model.

13. The clock circuit of claim 12, wherein the first system clock transmission circuit further comprises a current-mode logic to CMOS circuit, configured to be connected to the current-mode logic frequency divider circuit model and output the system clock signal.

14. The clock circuit of claim 12, wherein the second system clock transmission circuit further comprises a current-mode logic to CMOS circuit, configured to output the system clock signal to the CMOS frequency divider circuit model.

15. The clock circuit of claim 10, wherein each of the first system clock transmission circuit and the second system clock transmission circuit comprises a buffer, configured to buffer and receive the system clock signal.

16. The clock circuit of claim 15, wherein the buffer is a current-mode logic buffer.

17. The clock circuit of claim 10, wherein the data strobe clock circuit further comprises a first selector circuit, and the first selector circuit is configured to select an output signal of one of the first data strobe clock transmission circuit and the second data strobe clock transmission circuit for output; and the system clock circuit further comprises a second selector circuit, and the second selector circuit is configured to select an output signal of one of the first system clock transmission circuit and the second system clock transmission circuit for output.

18. The clock circuit of claim 17, further comprising a handshake circuit, connected to outputs of the first selector circuit and the second selector circuit and configured to determine a phase relationship between the system clock signal and the data strobe clock signal.

19. A memory, comprising:
a clock circuit, comprising:
  a data strobe clock circuit, configured to receive a data strobe clock signal and transmit the data strobe clock signal, wherein the data strobe clock signal is used for controlling at least one of receiving or sending of a data signal; and
  a system clock circuit configured to receive a system clock signal and transmit the system clock signal, wherein the system clock signal is used for controlling receiving of a command signal;
  wherein the system clock circuit comprises at least two first signal transmission paths, and is configured to transmit the system clock signal via different first signal transmission paths among the at least two first signal transmission paths based on at least one of: different receiving rates, or sending rates of the data signal;
  wherein the data strobe clock circuit comprises at least two second signal transmission paths, the data strobe clock signal is transmitted via different second signal transmission paths among the at least two second signal transmission paths at different transmission rates, each of the transmission rates corresponds to a respective one of the at least one of: the receiving rates, or the sending rates of the data signal, and each of the at least two second signal transmission paths is matched with a respective one of the at least two first signal transmission paths; and
  wherein the system clock circuit is configured to transmit, when the data strobe clock signal is transmitted via a second signal transmission path in the at least two second signal transmission paths, the system clock signal via a first signal transmission path in the at least two first signal transmission paths matching with the second signal transmission path.

* * * * *